(12) United States Patent
Goller et al.

(10) Patent No.: US 6,867,471 B2
(45) Date of Patent: Mar. 15, 2005

(54) UNIVERSAL PACKAGE FOR AN ELECTRONIC COMPONENT WITH A SEMICONDUCTOR CHIP AND METHOD FOR PRODUCING THE UNIVERSAL PACKAGE

(75) Inventors: Bernd Goller, Otterfing (DE); Robert-Christian Hagen, Sarching (DE); Gerald Ofner, Bad Abbach (DE); Christian Stuempfl, Schwandorf (DE); Stefan Wein, Regensburg (DE); Holger Wörner, Regensburg (DE)

(73) Assignee: Infineon Technologies AG, Munich (DE)

( * ) Notice: Subject to any disclaimer, the term of this patent is extended or adjusted under 35 U.S.C. 154(b) by 9 days.

(21) Appl. No.: 10/652,362

(22) Filed: Aug. 29, 2003

(65) Prior Publication Data

US 2004/0041251 A1 Mar. 4, 2004

(30) Foreign Application Priority Data

Aug. 29, 2002 (DE) .......................................... 102 40 461

(51) Int. Cl.[7] ..................... H01L 21/04; H01L 21/4763; H01L 29/72
(52) U.S. Cl. ....................... 257/501; 257/513; 257/520; 257/622
(58) Field of Search ................................ 257/684, 690, 257/787

(56) References Cited

U.S. PATENT DOCUMENTS

| 5,306,670 | A | | 4/1994 | Mowatt et al. |
|---|---|---|---|---|
| 5,976,912 | A | * | 11/1999 | Fukutomi et al. ........... 438/110 |
| 6,239,482 | B1 | | 5/2001 | Fillion et al. |
| 6,717,276 | B2 | * | 4/2004 | Walter et al. ................ 257/779 |
| 6,720,647 | B2 | * | 4/2004 | Fukuizumi ................... 257/704 |
| 2002/0048828 | A1 | * | 4/2002 | Sakamoto et al. ............ 438/15 |
| 2002/0110956 | A1 | | 8/2002 | Kumamoto et al. |
| 2003/0102538 | A1 | | 6/2003 | Paulus |
| 2003/0116840 | A1 | | 6/2003 | Hacke et al. |

FOREIGN PATENT DOCUMENTS

| DE | 100 29 269 A1 | 1/2002 |
|---|---|---|
| DE | 100 31 204 A1 | 1/2002 |
| DE | 101 37 184 A1 | 2/2003 |
| EP | 0 186 818 B1 | 7/1986 |
| EP | 0 439 134 A2 | 7/1991 |
| JP | 09172043 A | 6/1997 |
| JP | 10242372 A | 9/1998 |
| JP | 11246672 A | 9/1999 |
| JP | 2001262254 A | 9/2001 |
| WO | 92/17901 | 10/1992 |
| WO | 03/015165 A2 | 2/2003 |

* cited by examiner

*Primary Examiner*—Jerome Jackson
*Assistant Examiner*—Jesse A. Fenty
(74) *Attorney, Agent, or Firm*—Laurence A. Greenberg; Werner H. Stemer; Gregory L. Mayback (57) ABSTRACT

An electronic component has a semiconductor chip with chip contacts. The chip contacts are mechanically fixed on a wiring structure and electrically connected to the wiring structure. The wiring structure is formed as a region of a structured metal plate or as a region of a structured metal layer of a metal-clad base plate. Ideally, a panel having a number of component positions is provided for receiving a number of such an electronic component.

38 Claims, 4 Drawing Sheets

UNIVERSAL PACKAGE FOR AN ELECTRONIC COMPONENT WITH A SEMICONDUCTOR CHIP AND METHOD FOR PRODUCING THE UNIVERSAL PACKAGE

BACKGROUND OF THE INVENTION

Field of the Invention

The invention relates to an electronic component with a semiconductor chip, and also to a panel with a number of component positions and to a method for their production.

In semiconductor production, it is endeavored to prefabricate electronic components as far as possible inexpensively as panels. Such production is known from U.S. Pat. No. 6,239,482. In this case, different production steps are carried out simultaneously for a number of electronic components, which however leads to problems in contacting and connecting the semiconductor chips embedded in a panel and their chip contacts with the wiring lines or contact vias brought up to the chip contacts. This has an adverse effect on the yield of serviceable electronic components per panel.

SUMMARY OF THE INVENTION

It is accordingly an object of the invention to provide a universal package for an electronic component with a semiconductor chip and a method for producing the universal package that overcome the above-mentioned disadvantages of the prior art devices and methods of this general type, with which the contacting and connecting problems are reduced.

With the foregoing and other objects in view there is provided, in accordance with the invention, an electronic component. The electronic component contains at least one wiring structure having contact terminal areas. The wiring structure is a region of a structured metal plate or a region of a metal-clad base plate having a structured metal layer. A semiconductor chip is provided and has contact areas and chip contacts disposed next to the contact areas. The chip contacts are mechanically fixed on the contact terminal areas of the wiring structure and electrically connected to the wiring structure.

According to the invention, the electronic component with the semiconductor chip that has chip contacts on its contact areas is specified. The chip contacts are mechanically fixed on the contact terminal areas of the wiring structure and electrically connected to the wiring structure. The wiring structure is in this case formed as a region of a structured metal plate. It may also be formed as a region of a structured metal layer of a metal-clad base plate.

The structured metal plate may be formed as a region of a metal plate that only has the wiring structure of an electronic component, while the remaining regions of the metal plate have been removed. The same applies to the region of a structured metal layer of a metal-clad base plate, which may have the wiring structure of the electronic component while the remaining metal layer and the base plate have been removed.

The invention can be easily seen from the microstructure of the wiring structure. This is because a wiring structure containing a structured metal plate or a structured metal layer of a metal-clad base plate is distinguished by the special structure of the metal crystals contained therein, which forms both during the rolling of the metal plate and during the rolling of a clad metal layer of a metal-clad base plate. The structure of the metal crystals of the wiring structure, recognizable as a rolling texture, has the advantage that the semiconductor chip is mechanically fixed in a controlled manner with its chip contacts on the contact terminal areas of the structure immediately and without special pretreatment, unlike in the case of electrodeposited or vapor-deposited or sputter-deposited metal layers. In this case, mechanically fixed is understood as meaning mechanical joining of the chip contacts of the semiconductor chip on the contact terminal areas of the wiring structure, for example by a joining method.

With such mechanical fixing, an electrical connection is at the same time ensured between the contact terminal areas of the wiring structure and the chip contacts of the semiconductor chip, so that the contacting and connecting problems are reduced. In a corresponding way, the yield of serviceable electronic components per panel is increased.

As chip contacts, the semiconductor chip may have solder balls, which take the form of balls of solder soldered onto the contact areas of the semiconductor chip. In addition, chip contacts may be formed as solder bumps, which are produced on the contact areas of a semiconductor chip by a printing technique with a subsequent sintering process. The chip contacts of a semiconductor chip may also be formed as area contacts, the contact areas of the semiconductor chips being increased in size and thickened for example by a solderable material. Head contacts, which have a thermocompression head and are known as stud bumps, are also possible as the chip contacts. In addition, chip contacts may also take the form of elevated terminal areas obtained by electrodepositing a metal on the contact areas as column contacts.

Furthermore, a panel with a number of component positions for electronic components is provided according to the invention. The panel has a self-supporting dimensionally stable sheet of plastic, in which a semiconductor chip is embedded in each component position. Each of the semiconductor chips has chip contacts on its contact areas. The chip contacts are mechanically fixed in each of the component positions on the contact terminal areas of the at least one wiring structure and electrically connected to the wiring structure.

The wiring structure is formed as a region of a structured metal plate or a structured metal layer of a metal-clad base plate. Both the region of the structured metal plate and the region of the structured metal layer of a metal-clad base plate have rolling textures which provide an indication of the use of such metal plates or metal layers. Metal plates or metal layers rolled in such a way and structured to form wiring structures have the advantage that, before their structuring, they can serve as a support plate for a panel with a number of component positions for the joining of the chip contacts of the semiconductor chip in the component positions and additionally as a support plate for the embedding of the components into a sheet of plastic.

Both the semiconductor chip with the chip contacts and the semiconductor chips of a panel are completely embedded in a single material, so that thermal stresses between different package materials are advantageously avoided. The material of the sheet of plastic in which the semiconductor chips are embedded may have a plastic package molding compound. Such a plastic package molding compound may have in particular an epoxy resin filled with electrically insulating particles. The epoxy resin with the electrically insulating particles allows the coefficient of thermal expansion of the plastic package molding compound to be adapted to the coefficient of thermal expansion of the semiconductor chips. Consequently, the thermal stresses at the interface between the semiconductor chip and the plastic package molding compound are minimized.

On the interfaces between the wiring structure and the sheet of plastic, the wiring structure may have an adhesive layer. The adhesive layer provides a secure anchorage of the wiring structure on the sheet of plastic. Furthermore, the adhesive layer may be applied to the non-structured metal plate or non-structured metal layer as a pattern with the contact terminal areas of the wiring structure left open. As a result, the adhesive layer additionally facilitates alignment of the semiconductor chips in the component positions of a panel.

The electronic component or the panel may have further wiring structures with wiring lines and/or contact vias. In this case, the contact vias are electrically connected to a further wiring structure and/or to external contact areas of the electronic component or the panel. Such continuing wiring structures may be applied by known processes to the at least one wiring structure of the present invention. Consequently, a multi-layered wiring structure may be disposed on the self-supporting dimensionally stable sheet of plastic without a separate multi-layered substrate being required, which reduces the production costs.

A method for producing a panel with a number of component positions for electronic components has essentially four method steps. These involve creating a panel in the form of a self-supporting dimensionally stable sheet of plastic in which there is embedded in each component position a semiconductor chip that has chip contacts on its contact areas.

First, for the production of the panel, a support plate that has a non-structured metal plate or a non-structured metal layer with a rolling texture is produced. Subsequently, semiconductor chips are aligned with their chip contacts on the metal of the support plate at predetermined component positions and fixed on predetermined component positions on the metal of the support plate. Consequently, the support plate and the semiconductor chips fixed on it form a spatial structure of a large area, it being possible for the semiconductor chips to be disposed in rows and columns. Thereafter, a sheet of plastic is produced on the support plate, with the semiconductor chips and their chip contacts, which are fixed on the metal of the support plate, being embedded in a plastic molding compound. Finally, the initially closed metal plate or the closed metal layer of the support plate is structured to form a wiring structure, the wiring structure having after this method step contact terminal areas on which the chip contacts are fixed and/or wiring lines and/or contact vias.

The method has the advantage that the chip contacts of the semiconductor chip can be reliably fixed on a metal plate or a metal layer even before the semiconductor chips are embedded in a plastic molding compound. Depending on the type of chip contacts, diffusion soldering, contact soldering or adhesive bonding may be used for the purpose for fixing the chip contacts on the metal of the support plate. The metal plate or the partial layer of the support plate is not completely removed after production of the plastic molding compound, but instead is used in an advantageous way for the production of at least one wiring structure. The wiring structure, for example a copper alloy, has a crystalline rolling texture.

To produce a support plate, a metal plate may be rolled thin, down to a thickness of between 50 and 150 micrometres. This produces the rolling structure of the metal crystals characteristic of this method. Working such a metal plate into a wiring structure allows only a limited fineness of the wiring structure on account of the thickness of the metal plate. The fineness of the wiring structure can be increased by a base plate with a metal layer being produced as a support plate.

Such a support plate may be composed of a printed circuit board material and be clad with a rolled metal foil by a coupling intermediate layer. Once such a base plate has been produced with a metal layer as a support plate, the base plate is separated from the metal layer for the structuring of the metal layer to form a wiring structure. To permit separation, the coupling properties of the intermediate layer between the base plate and the metal layer are adapted in such a way that the adhesive properties of the metal layer with respect to the sheet of plastic to be produced are much greater than with respect to the printed circuit board material.

To produce a base plate with a metal layer as a support plate of a panel, a soft, compliant base plate of elastomeric plastic may also be clad with a rolled metal foil by the coupling intermediate layer. Here, too, the properties of the coupling intermediate layer may be adjusted in such a way that the adhesion with respect to the flexible base plate is less than the adhesion of the metal foil on the sheet of plastic to be produced.

On account of the soft compliant base plate of elastomeric plastic, the base plate can be pulled off from the sheet of plastic to be produced, with embedded semiconductor chips, leaving the metal layer behind, before structuring of the metal layer to form a wiring structure is carried out. It can be seen as a further advantage of a soft compliant base plate of elastomeric plastic with an applied rolled metal foil that the semiconductor chips can be pressed with their chip contacts into the metal foil after alignment, so that the position of the chip contacts is marked on the rear side of the metal layer and introduction of a wiring structure from the rear side of the metal layer is facilitated.

In the production of the support plate, adjusting marks may be provided on the metal of the support plate in order to facilitate the alignment of the semiconductor chips in the component positions. Such adjusting marks may be provided by applying solderable material in the positions of the contact terminal areas. In addition, adjusting marks may be provided on both sides on the metal of the support plate, in order on the one hand to align the semiconductor chips with their chip contacts in every component position on one side of the metal plate or of the metal layer, and on the other hand to recognize these positions from the opposite side during the structuring of the metal plate of the metal layer. Suitable as possible adjusting marks on both sides are through-openings in the metal of the support plate, which are made into the metal of the support plate at corresponding positions. Adjusting marks may also be formed as dents in the metal layer, in particular if the base plate is produced from a soft compliant material. The dents are then produced by corresponding chip contacts such as solder balls, solder bumps, head contacts or column contacts of the semiconductor chips when the semiconductor chip is placed onto the metal layer.

If the chip contacts are formed in the form of area contacts or elevated terminal areas on the contact areas of the semiconductor chips, such an impression of the contact areas of the semiconductor chip is not readily possible, so that specially prepared adjusting marks on both sides have to be provided. Another advantage of using area contacts as the chip contacts is that a mechanically stable connection can be established between the metal of the carrier plate and the area contacts by diffusion soldering of the area contacts on the metal layer or on the metal plate.

If the semiconductor chips have chip contacts in the form of solder balls, solder bumps and/or head contacts, they can be fixed on the metal of the support plate by soft soldering after alignment of the semiconductor chips. Very stable fixing of the semiconductor chips by the chip contacts on the metal of the support plate is likewise ensured by the soft soldering.

The semiconductor chips being fixed in such a way on the metal of the support plate makes it possible with further method steps to produce a sheet of plastic by an injection-molding technique, since the fixing of the chip contacts according to the invention is extremely stable and secure. During the injection-molding, the semiconductor chips are embedded within an injection mold into a plastic molding compound, the injection mold being filled with the plastic molding compound under high pressure. In this operation, which is also known as "transfer molding", there is no risk of the plastic molding compound forcing its way between the metal of the support plate and the fixed chip contacts, since a particularly secure mechanical connection has previously been produced between the metal of the support plate and the chip contacts.

To improve the anchorage between the plastic molding compound and the metal of the support plate, the region of the wiring structure of the metal of the support plate may be provided with an adhesive layer. The adhesive layer may form an adjustment pattern, which is applied to the metal even before the metal of the support plate is loaded with the semiconductor chips. In this case, the contact terminal areas of the wiring pattern are kept free of the adhesive layer, in order to ensure a secure connection between the chip contacts of the semiconductor chip and the metal of the support plate.

To produce a sheet of plastic, the support plate with the semiconductor chips fixed on it may also be covered with granules of plastic. The granules of plastic are preferably melted under a vacuum and distribute themselves while the semiconductor chips are embedded on the support plate. In order to improve the planarizing of the granules of plastic, a mold plate may be applied to the molten plastic molding compound plane-parallel to the support plate. Consequently, the upper side of the sheet of plastic is planarized in an advantageous way. By applying a vacuum during the melting, air inclusions in the sheet of plastic are prevented.

A further possibility for producing a sheet of plastic with the aid of the support plate is to cover the semiconductor chips with dispensed plastic. In the case of the method, plastic is applied in a liquid state to the support plate, the plastic distributing itself uniformly and embedding the semiconductor chips.

After producing a self-supporting, dimensionally stable sheet of plastic, the metal plate or metal layer of the support plate can be structured. For this purpose, if a non-metal base plate has been used, the base plate is pulled off from the metal layer and the metal layer is subsequently selectively etched, an etching mask protecting the structure of the wiring structure. Apart from wet etching, dry etching may also be carried out, for which purpose the metal layer or the metal plate is subjected to a plasma etching process.

Further possibilities for introducing precise structures into the metal plate or the metal layer are to structure the closed metal plate or the metal layer by laser ablation. Further wiring structures may be disposed on the wiring structure, in that the insulating layers with the contact vias and the insulating layers with the wiring lines are alternately disposed on the at least one wiring structure. The further wiring structures may be realized by conventional processes, so that a panel which has a multi-layered wiring structure is produced. Subsequently, external contacts may be applied on an outer wiring structure of the panel before the panel is divided into individual electronic components by separating the panel along the limits of each component position.

To summarize, it can be stated that the invention is based on use of a support plate which both serves for fixing and positioning the semiconductor chips during the production of a so-called "expanded" wafer, and serves later for the production of the first wiring layer of a package. Such an "expanded" wafer or panel has the advantage that the production steps for electronic components according to the invention can be simultaneously carried out in parallel for a number of components. For this purpose, semiconductor chips can first be provided with elevated contact structures. All the chips as presented above are suitable for this purpose. The semiconductor chips are then applied with their chip contacts to a full-area unstructured metallic support and contacted by soft soldering, diffusion soldering and/or alloying. Used for this purpose, the support plate is a conducting rolled metal material, which is suitable both for the contacting of the semiconductor chips and as a material for the interconnects of a first wiring layer.

Suitable materials are copper and copper alloy. After the chip contacts of the semiconductor chips have been fixed on the support plate, the construction can be encapsulated, it being possible for dispersion methods or else transfer molding methods to be used. Subsequently, the metallic support can be photolithographically worked and the structure of the first wiring layer can thereby be etched out of the full-area unstructured metallic support plate. Further layers with wiring lines can be applied to the first wiring layer by conventional processes, such as a thin-film technique. The advantages of the method according to the invention for producing an electronic component or a panel for a number of electronic components are as now described.

No separate support that has to be discarded is required for mounting. The use of a support that can be used in the rest of the method saves costs.

With this technology, a construction in which the semiconductor chip is completely surrounded by the same material both above and below the semiconductor chip can be realized. The advantage lies in greater reliability, since the semiconductor chip is mechanically fixed all around and the probability of delamination at the semiconductor flanks is reduced.

The complete embedding of the semiconductor chip even above the active chip area has the effect of further increasing the reliability of the construction, since the wiring layers can be applied to a uniform base area. Consequently, the further wiring and insulating layers do not have to be additionally adapted to the material of the semiconductor chip with respect to their adhesion.

Since the contacting of the chip contacts on the metal of the support plate is not achieved by depositing or applying processes but by reliable joining methods, altogether greater reliability is obtained for the construction of the electronic component. The risk of delamination between the first wiring layer of a rolled metal plate or a rolled metal layer and the semiconductor chip and the upper side of the package is reduced with the method according to the invention.

Altogether, the procedure of the method is simplified significantly, since the component loading process and the encapsulating process can be achieved with established technologies. In particular, grinding processes for exposing chip contacts in a plastic molding compound are avoided.

The method avoids critical imaging problems and the risk of contamination between chip contacts and the first wiring layer.

Other features which are considered as characteristic for the invention are set forth in the appended claims.

Although the invention is illustrated and described herein as embodied in a universal package for an electronic component with a semiconductor chip and a method for producing the universal package, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
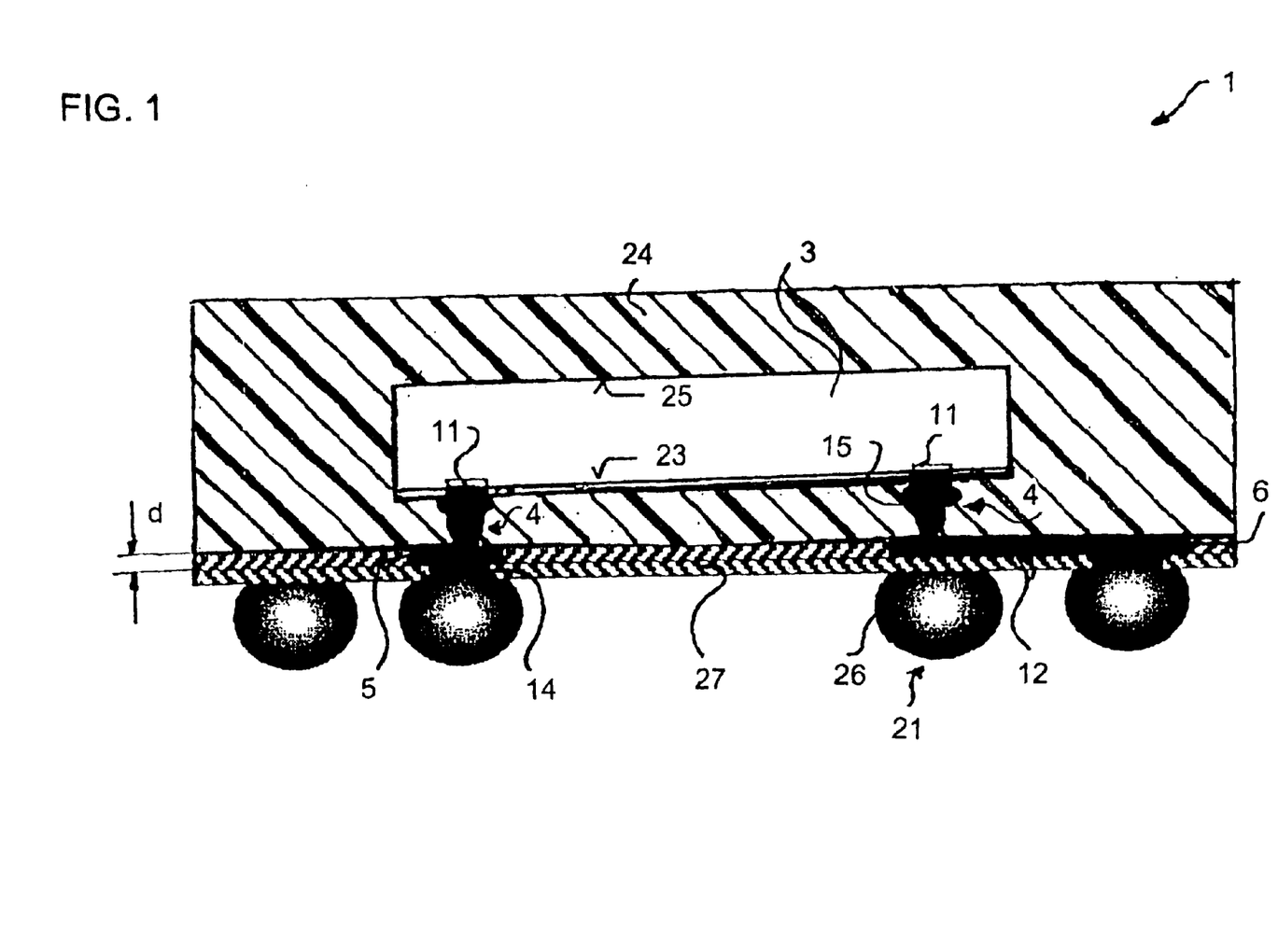
FIG. 1 is a diagrammatic, cross-sectional view through an electronic component according to a first embodiment of the invention.

Referring now to the figures of the drawing in detail and first, particularly, to FIG. 1 thereof, there is show a schematic cross-section view through an electronic component 1 according to a first embodiment of the invention. The electronic component 1 has a semiconductor chip 3 with an active upper side 23 and a passive rear side 25. Disposed on the active upper side 23 are contact areas 11, which bear chip, contacts 4. In the first embodiment of the invention, the chip contacts 4 are formed as head contacts 15 or stud bumps. The head contacts 15 are fixed on contact terminal areas 5 of a wiring structure 6. The wiring structure 6 is formed from a region of a structured metal plate or, by a method not illustrated here, from a region of a structured metal layer. The structured metal plate or the structured metal layer is produced from a rolled copper alloy and has a rolling texture. The rolling texture is also evident on the wiring structure 6. As long as the wiring structure 6 is not covered, the rolling texture can often be seen with the naked eye.

Apart from the contact terminal areas 5, on which the head contacts 15 are fixed, the wiring structure 6 also has wiring lines 12, which connect the contact terminal areas 5 to external contact areas 14 of the electronic component 1. A thickness d of the wiring structure 6 lies between 50 and 150 $\mu$m. The external contact areas 14 are surrounded by a solder resist layer 27 and bear external contacts 21, which in this embodiment of the invention are formed as solder balls 26. The solder resist layer 27 prevents the soldering material of the solder balls 26 from wetting the wiring lines 12 during the soldering of the solder balls 26. The semiconductor chip 3 is completely embedded with its chip contacts 4 in a single plastic molding compound 24.

Figure 2:
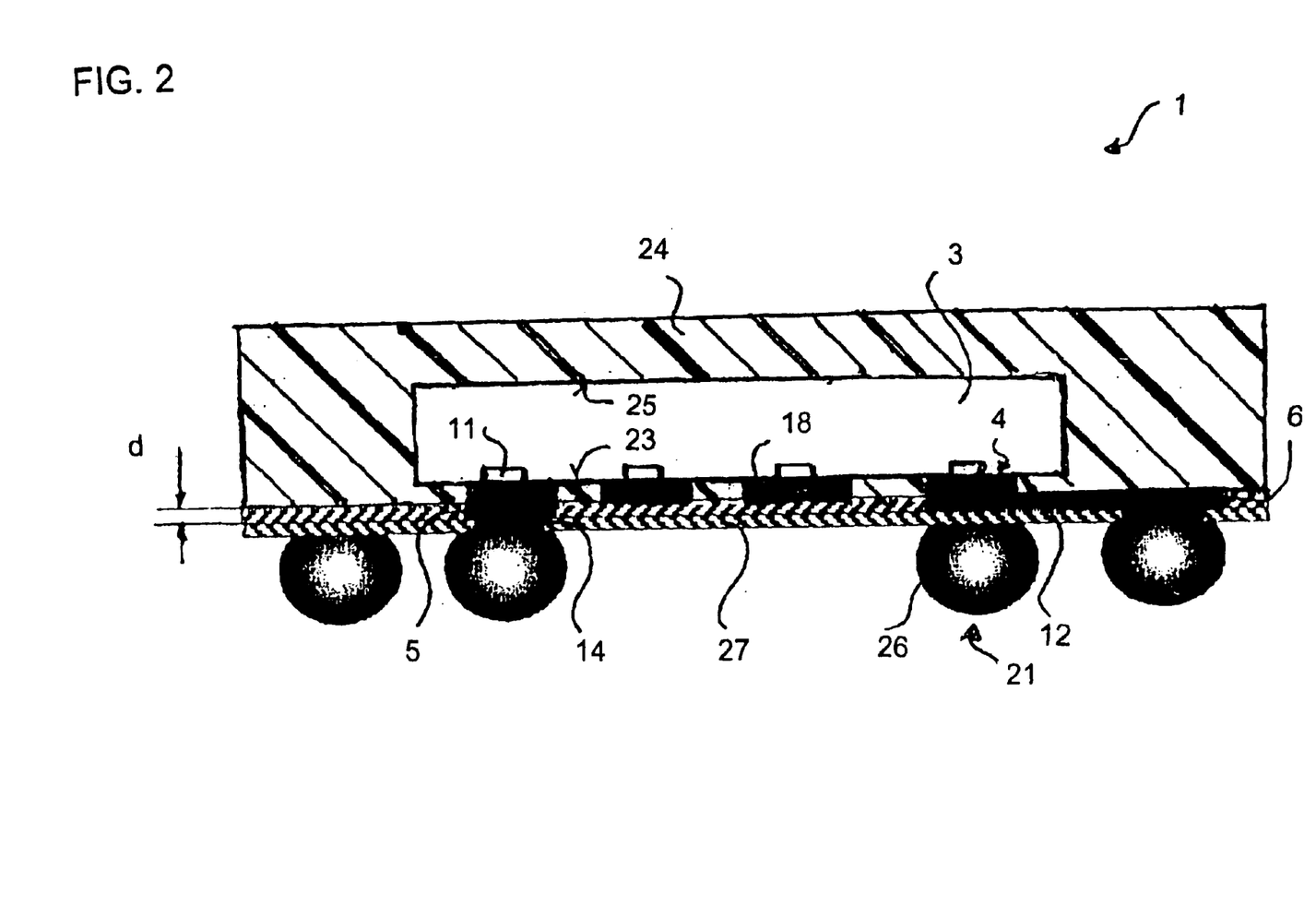
FIG. 2 is a diagrammatic, cross-sectional view through the electronic component according to a second embodiment of the invention.

FIG. 2 shows a schematic cross section through the electronic component 1 according to a second embodiment of the invention.

Components with the same functions as in FIG. 1 are identified by the same reference numerals and not separately explained.

The second embodiment of the invention according to FIG. 2 differs from the first embodiment of the invention by the type of the chip contacts 4 on the contact areas 11 on the active upper side 23 of the semiconductor chip 3. The chip contacts 4 are formed as area contacts 18 and have an alloy that can be diffusion-soldered with the material of the contact terminal areas 5 of the wiring structure 6. Furthermore, the thickness d of the metal of the wiring structure 6 has been reduced to the thickness of a metal layer of between 0.5 and 50 $\mu$m.

FIGS. 3 to 6 shown schematic cross-section views through intermediate products during the production of a panel 2 according to the invention for a number of electronic components. Components of FIGS. 3 to 6 with functions as in the previous figures are identified by the same reference numerals and are not separately explained.

Figure 3:
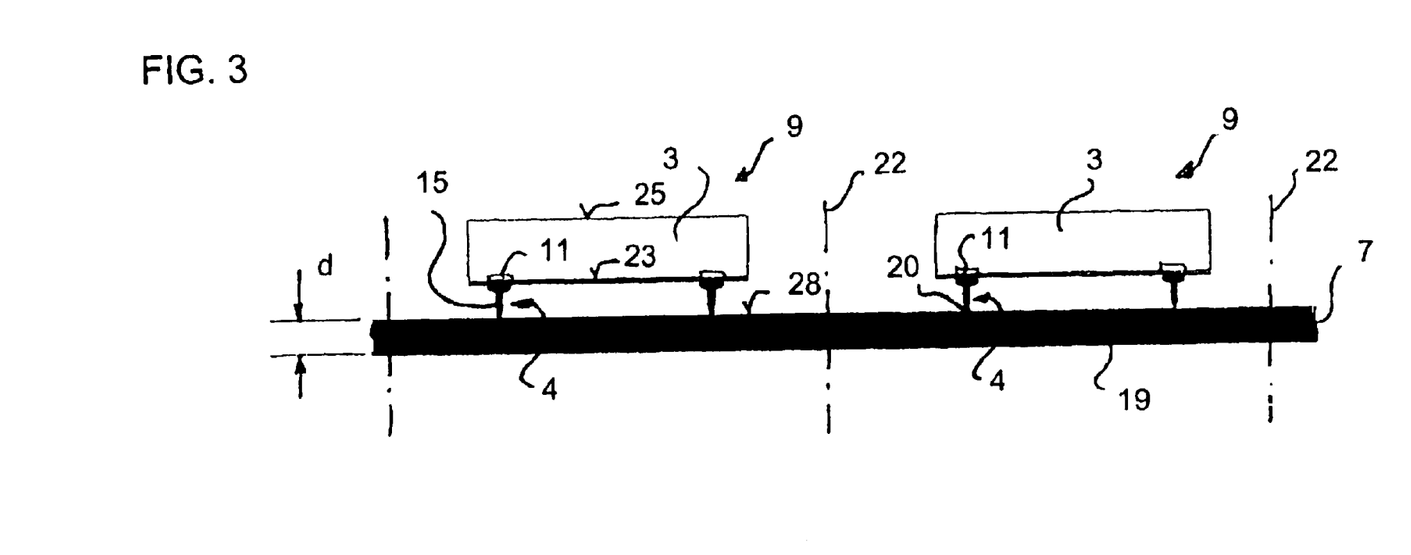
FIG. 3 is a diagrammatic, cross-sectional view through semiconductor chips after aligning and fixing of their chip contacts on a metallic support plate.

FIG. 3 shows a schematic cross section through semiconductor chips 3 after aligning and fixing of the chip contacts 4 on a metallic support plate 19. The metallic support plate 19 has component positions 9, the limits of which are shown in FIG. 3 by dash-dotted lines 22. The support plate 19 is formed from a copper alloy, which has been rolled to a thickness d, so that the metallic support plate 19 exhibits a rolling texture.

In an embodiment not shown here, the thickness d is reduced to the thickness of a metal layer of a non-illustrated metal-clad base plate, the thickness d of the metal layer lying between 0.5 $\mu$m and 50 $\mu$m. The non-illustrated base plate is either a printed circuit board or a soft flexible film of elastomeric plastic.

On the metallic support 19, the chip contacts 4 have been soldered at fixing points 20. An upper side 28 of the metallic support plate 19 is covered with a coupling intermediate layer with the exception of the fixing points 20. As a result, an exact alignment of the semiconductor chips 3 on the metallic support plate 19 is made possible at the same time. After the fixing of the chip contacts 4 by soft soldering at the fixing points 20, the semiconductor chips 3 can be embedded in a plastic molding compound 24.

Figure 4:
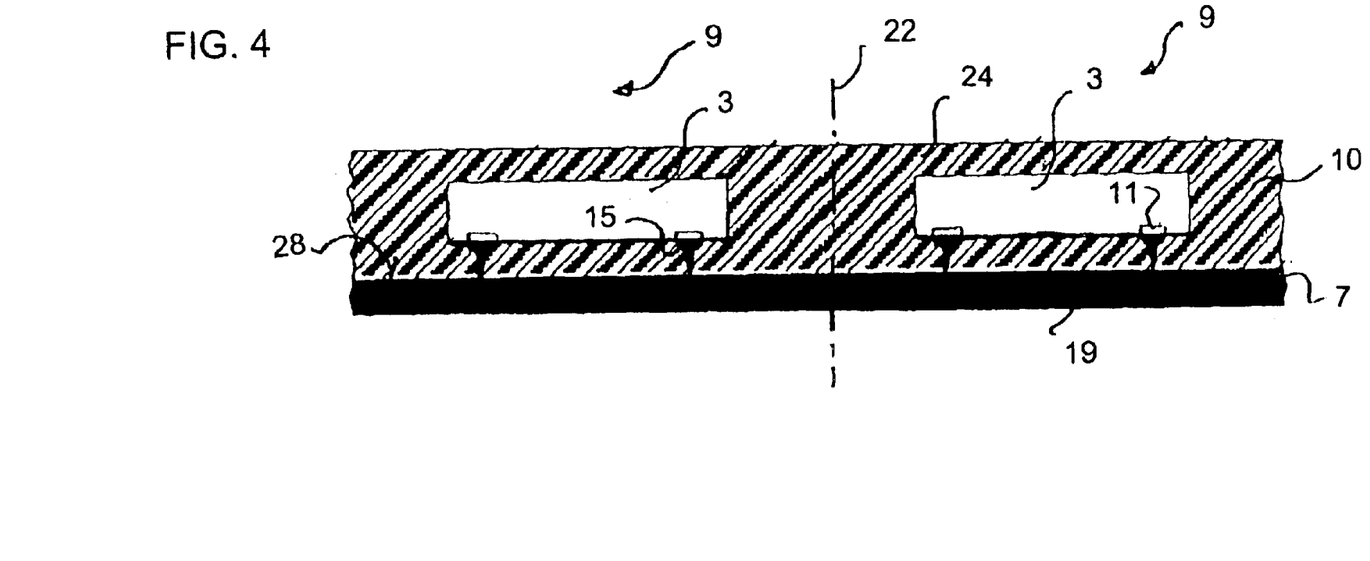
FIG. 4 is a diagrammatic, cross-sectional view through a sheet of plastic with the semiconductor chips embedded therein on the metallic support plate shown in FIG. 3.

FIG. 4 shows a schematic cross section through a sheet of plastic 10 with the semiconductor chips 3 embedded therein on the metallic support plate 19 from FIG. 3. After the sheet of plastic 10 has been produced, the plastic molding compound 24 of filled epoxy resin completely surrounds the semiconductor chips 3 with their chip contacts 4. For this purpose, the metallic support plate 19 is coated on one side, on its upper side 28, with the plastic molding compound 24.

Figure 5:
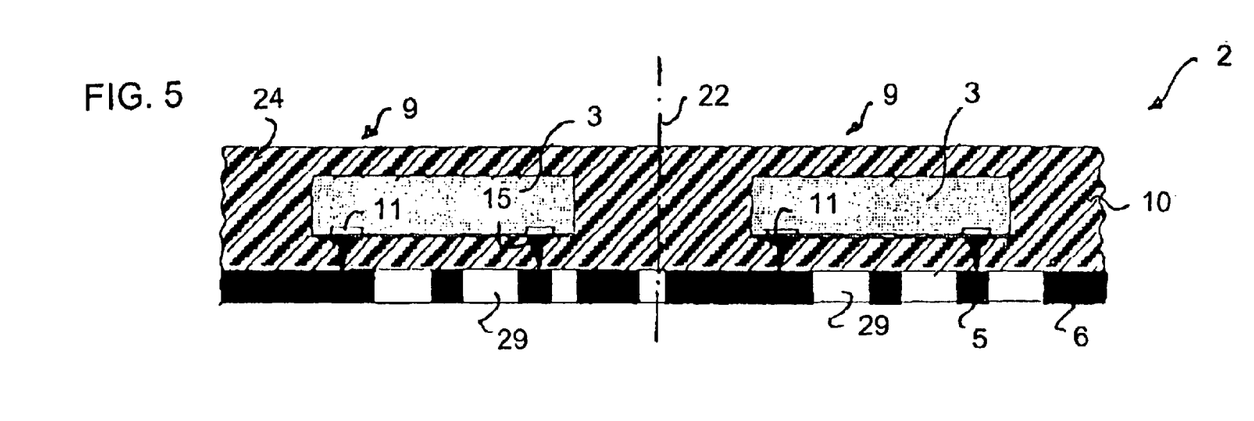
FIG. 5 is a diagrammatic, cross-sectional view through a panel after the structuring of the metallic support plate from FIGS. 3 and 4 to form a wiring structure.

FIG. 5 shows a schematic cross section through the panel 2 after structuring of the metallic support plate 19 of FIGS. 3 and 4 into a wiring structure 6. For the structuring of the closed metallic support plate 19 shown in FIGS. 3 and 4 to form the wiring structure 6, a photoresist mask is applied to the metallic support plate. Subsequently, regions 29 not covered by the photoresist mask are etched out, so that, of the metallic support plate 19, a wiring structure 6 is left behind. The wiring structure 6 has the same crystalline structure as the metallic support plate 19 shown in FIGS. 3 and 4 and is consequently characterized by a rolling texture.

Figure 6:
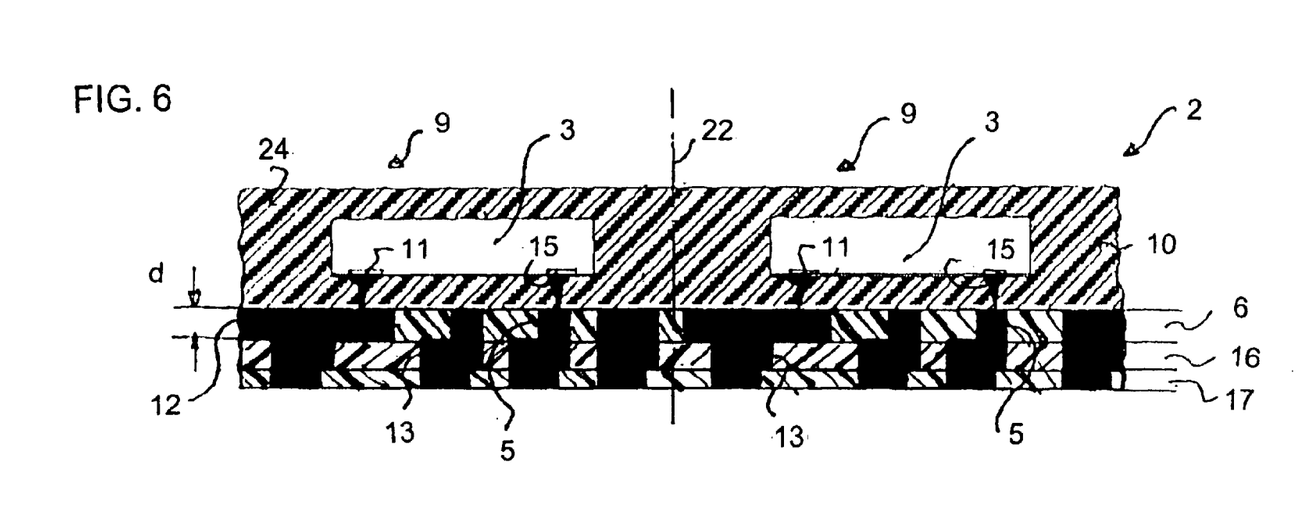
FIG. 6 is a diagrammatic, cross-sectional view through the panel shown in FIG. 5 after applying further wiring layers.

FIG. 6 shows a schematic cross section through the panel 2 after applying further wiring layers 16 and 17 to the wiring structure 6 of FIG. 5. The further wiring layers 16 and 17 have been applied by conventional printing techniques, in order to realize a multi-layered wiring structure. Subsequently, further non-illustrated insulating layers, which have contact vias and/or external contact areas on which non-illustrated external contacts have been applied, are applied to the panel 2.

We claim:

1. An electronic component, comprising:
   at least one wiring structure having contact terminal areas, external contact areas, and at least one of wiring lines and contact vias, said wiring structure selected from the group consisting of a region of a structured metal plate and a region of a metal-clad base plate having a structured metal layer;
   a semiconductor chip having contact areas and chip contacts disposed next to said contact areas, said chip contacts mechanically fixed on said contact terminal areas of said wiring structure and electrically connected to said wiring structure; and
   at least one further wiring structure said contact vias electrically connected to said at least one further wiring structure and to said external contact areas of said wiring structure.

2. The electronic component according to claim 1, further comprising a single material completely embedding said semiconductor chip and said chip contacts.

3. The electronic component according to claim 1, wherein said structured metal plate and said structured metal layer are formed of a copper alloy.

4. The electronic component according to claim 1, wherein said structured metal plate and said structured metal layer each have a pattern of a solderable metal coating on at least an upper side.

5. The electronic component according to claim 1, wherein said wiring structure has adjusting marks on both sides.

6. The electronic component according to claim 1, wherein said contact terminal areas each have a dent formed therein in which one of said chip contacts is respectively fixed.

7. The electronic component according to claim 1, wherein said chip contacts have at least one of solder balls, solder bumps, head contacts, column contacts and area contacts.

8. The electronic panel according to claim 1, further comprising a sheet of plastic formed from a plastic molding compound embedding said semiconductor chip.

9. The electronic panel according to claim 8, wherein said plastic molding compound is an epoxy resin filled with electrically insulating particles.

10. The electronic panel according to claim 8, wherein said wiring structure has an adhesive layer on interfaces with respect to said sheet of plastic.

11. A panel, comprising:
    at least one wiring structure having contact terminal areas, external contact areas, and at least one of wiring lines and contact vias, said wiring structure selected from the group consisting of a region of a structured metal plate and a region of a metal-clad base plate having a structured metal layer, said wiring structure defining a number of component positions for electronic components;
    semiconductor chips having contact areas and chip contacts disposed next to said contact areas, said chip contacts mechanically fixed to said contact terminal areas of said wiring structure and electrically connected to said wiring structure, one of said semiconductor chips disposed at each of said component positions;
    a sheet of plastic being a self-supporting dimensionally stable sheet of plastic embedding said semiconductor chips; and
    at least one further wiring structure, said contact vias electrically connected to said at least one further wiring structure and to said external contact areas of said wiring structure.

12. The electronic panel according to claim 11, wherein said sheet of plastic is formed of a single material completely embedding said semiconductor chips and said chip contacts.

13. The electronic panel according to claim 11, wherein said structured metal plate and said structured metal layer are each formed of a copper alloy.

14. The electronic panel according to claim 11, wherein said structured metal plate and said structured metal layer each have a pattern of a solderable metal coating on at least an upper side.

15. The electronic panel according to claim 11, wherein said wiring structure has adjusting marks disposed on both sides.

16. The electronic panels according to claim 11, wherein said contact terminal areas each have a dent formed therein in which one of said chip contacts is respectively fixed.

17. The electronic panel according to claim 11, wherein said chip contacts have at least one of solder balls, solder bumps, head contacts, column contacts and area contacts.

18. The electronic panel according to claim 11, wherein said sheet of plastic is formed of a plastic molding compound.

19. The electronic panel according to claim 18, wherein said plastic molding compound is an epoxy resin filled with electrically insulating particles.

20. The electronic panel according to claim 11, wherein said wiring structure has an adhesive layer on interfaces with respect to said sheet of plastic.

21. A method for producing a panel, which comprises the steps of:
    producing a support plate having a metal part selected from the group consisting of a non-structured metal plate and a non-structured metal layer, said support plate further having predetermined component positions;
    aligning chip contacts of a semiconductor chip at each of said predetermined component positions of the metal part of the support plate and fixing the semiconductor chips at the predetermined component positions;
    embedding the semiconductor chips and the chip contacts fixed on the metal part of the support plate in a plastic molding compound resulting in a formation of a sheet of plastic;

structuring the metal part of the support plate to form a wiring structure with at least one of contact terminal areas on which the chip contacts are fixed, wiring lines, and contact vias; and forming further wiring structures by alternately disposing insulating layers with contact vias and insulating layers with wiring lines on the wiring structure.

22. The method according to claim 21, which further comprises rolling the non-structured metal plate down to a thickness of between 50 and 150 micrometres for forming the support plate.

23. The method according to claim 21, which further comprises cladding a base plate of a printed circuit board material with a rolled metal foil using a coupling intermediate layer to produce the support plate formed of the non-structured metal layer.

24. The method according to claim 21, which further comprises cladding a soft, compliant base plate of an elastomeric plastic with a rolled metal foil using a coupling intermediate layer for producing the base plate formed of the non-structured metal layer.

25. The method according to claim 21, which further comprises providing the metal part of the support plate with adjusting, marks.

26. The method according to claim 21, which further comprises forming through-openings functioning as adjusting marks in the metal part of the support plate.

27. The method according to claim 21, which further comprises forming dents in the non-structured metal layer of the support plate at fixing points for the chip contacts and the dents function as adjusting marks.

28. The method according to claim 21, which further comprises mechanically fixing the chip contacts in a form of area contacts on the metal part of the support plate by diffusion soldering.

29. The method according to claim 21, which further comprises fixing the chip contacts selected from the group consisting of solder balls, solder bumps and head contacts on the metal part of the support plate by soft soldering after alignment of the semiconductor chip.

30. The method according to claim 21, which further comprises producing the sheet of plastic by introducing the support plate with the semiconductor chips fixed thereto into an injection mold, and the injection mold is filled with the plastic molding compound with the semiconductor chips being embedded in the plastic molding compound.

31. The method according to claim 21, which further comprises:

covering the support plate with the semiconductor chips fixed thereto with granules of plastic;

heating the support plate resulting in the granules being melted and forming a molten plastic molding compound; and applying a mold plate to the molten plastic molding compound plane-parallel to the support plate for forming the sheet of plastic.

32. The method according to claim 21, which further comprises producing the sheet of plastic by covering the support plate with the semiconductor chips fixed thereto with dispensed plastic resulting in the semiconductor chips being embedded therein.

33. The method according to claim 23, which further comprises aligning and applying an etching mask; and wet etching the metal part of the support plate for forming a wiring structure with the contact terminal areas, on which the chip contacts are fixed, with wiring lines, and with contact vias.

34. The method according to claim 33, which further comprises removing the base plate from the metal part before performing the wet etching of the metal part of the support plate.

35. The method according to claim 23, which further comprises:

removing the base plate from the metal part; and structuring the metal part of the support plate to form a wiring structure.

36. The method according to claim 21, which further comprises applying external contacts to an outer most one of the further wiring structures of the panel.

37. The method according to claim 21, which further comprises applying external contacts to the wiring structure of the panel.

38. A method for producing an electronic component, which comprises the steps of:

producing a panel according to the steps of:

producing a support plate having a metal part selected from the group consisting of a non-structured metal plate and a non-structured metal layer, said support plate further having predetermined component positions;

aligning chip contacts of a semiconductor chip at each of said predetermined component positions of the metal part of the support plate and fixing the semiconductor chips at the predetermined component positions;

embedding the semiconductor chips and the chip contacts fixed on the metal part of the support plate in a plastic molding compound resulting in a information of a sheet of plastic;

structuring the metal part of the support plate to form a wiring structure with at least one of contact terminal areas on which the chip contacts are fixed, wiring lines, and contact vias; and forming further wiring structures by alternately disposing insulating layers with contact vias and insulating layers with wiring lines on the wiring structure; and separating the panel along limits of each of the predetermined component positions of the panel.

* * * * *

UNITED STATES PATENT AND TRADEMARK OFFICE
CERTIFICATE OF CORRECTION

PATENT NO. : 6,867,471 B2
DATED : March 15, 2005
INVENTOR(S) : Bernd Goller et al.

It is certified that error appears in the above-identified patent and that said Letters Patent is hereby corrected as shown below:

Column 9,
Line 34, should read as follows, -- as least one further wiring structure, said contact vias --

Signed and Sealed this

Seventh Day of June, 2005

JON W. DUDAS
*Director of the United States Patent and Trademark Office*